United States Patent
Makino et al.

(10) Patent No.: US 8,093,148 B2
(45) Date of Patent: Jan. 10, 2012

(54) METHOD FOR MANUFACTURING SEMICONDUCTOR DEVICE HAVING ELECTRODE FOR EXTERNAL CONNECTION

(75) Inventors: Yutaka Makino, Tokyo (JP); Masamitsu Ikumo, Tokyo (JP); Hiroyuki Yoda, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 304 days.

(21) Appl. No.: 12/570,459

(22) Filed: Sep. 30, 2009

(65) Prior Publication Data

US 2010/0081269 A1    Apr. 1, 2010

(30) Foreign Application Priority Data

Oct. 1, 2008   (JP) .................................. 2008-256154

(51) Int. Cl.
*H01L 21/44* (2006.01)
(52) U.S. Cl. ..................... 438/614; 438/612; 438/613
(58) Field of Classification Search .................. 438/612, 438/613, 614
See application file for complete search history.

(56) References Cited

U.S. PATENT DOCUMENTS

| | | | | | |
|---|---|---|---|---|---|
| 5,937,320 | A | * | 8/1999 | Andricacos et al. | 438/614 |
| 6,818,545 | B2 | * | 11/2004 | Lee et al. | 438/614 |
| 2004/0129344 | A1 | | 7/2004 | Arita et al. | |
| 2011/0014785 | A1 | * | 1/2011 | Shimizu | 438/613 |
| 2011/0024905 | A1 | * | 2/2011 | Lin et al. | 257/738 |
| 2011/0101527 | A1 | * | 5/2011 | Cheng et al. | 257/738 |

FOREIGN PATENT DOCUMENTS

| | | |
|---|---|---|
| JP | 08-045941 A | 2/1996 |
| JP | 09-199505 A | 7/1997 |
| JP | 2004-174538 A | 6/2004 |

* cited by examiner

*Primary Examiner* — Fernando L Toledo
(74) *Attorney, Agent, or Firm* — Westerman, Hattori, Daniels & Adrian, LLP

(57) ABSTRACT

A method for manufacturing semiconductor device which includes forming a first metal film over an electrode pad disposed on a substrate, forming a second metal film on the first metal film, forming a first oxide film on a surface of the first metal film and a second oxide film on a surface of the second metal film by oxidizing the surfaces of the first metal film and the second metal film, removing the first oxide film, and melting the second metal film after removing the first oxide film.

13 Claims, 17 Drawing Sheets

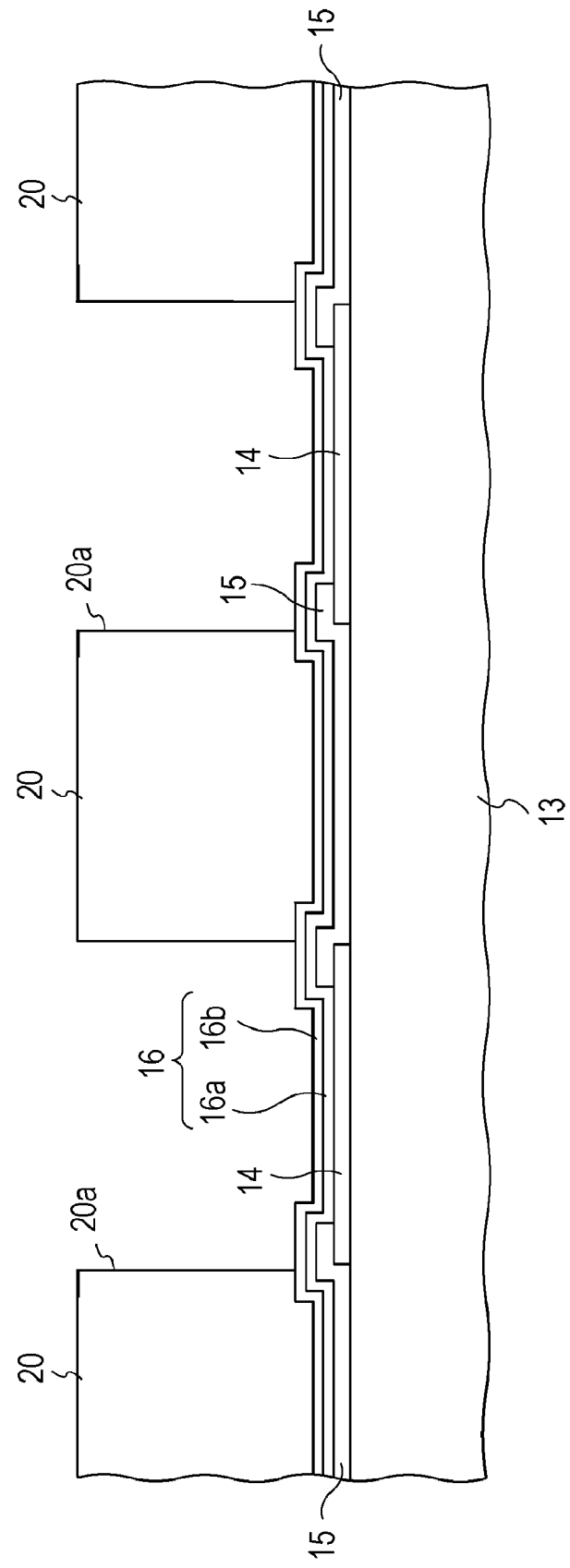

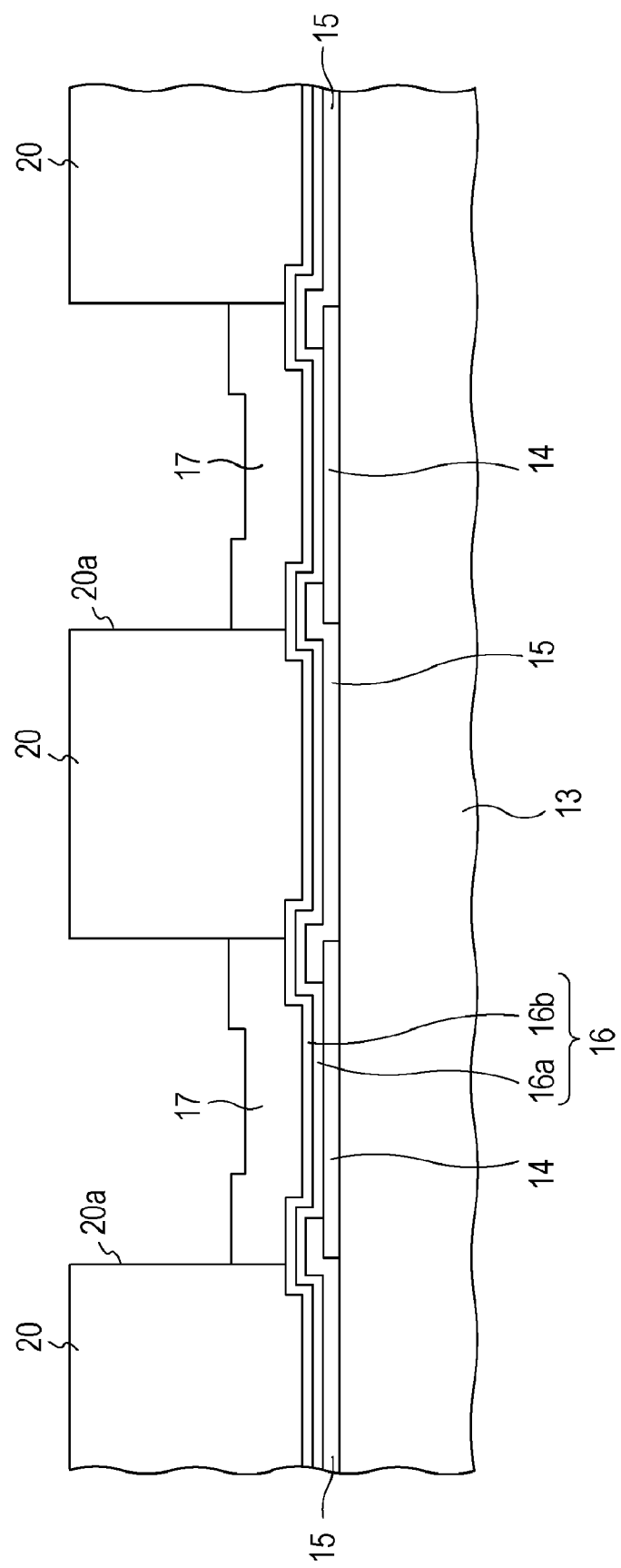

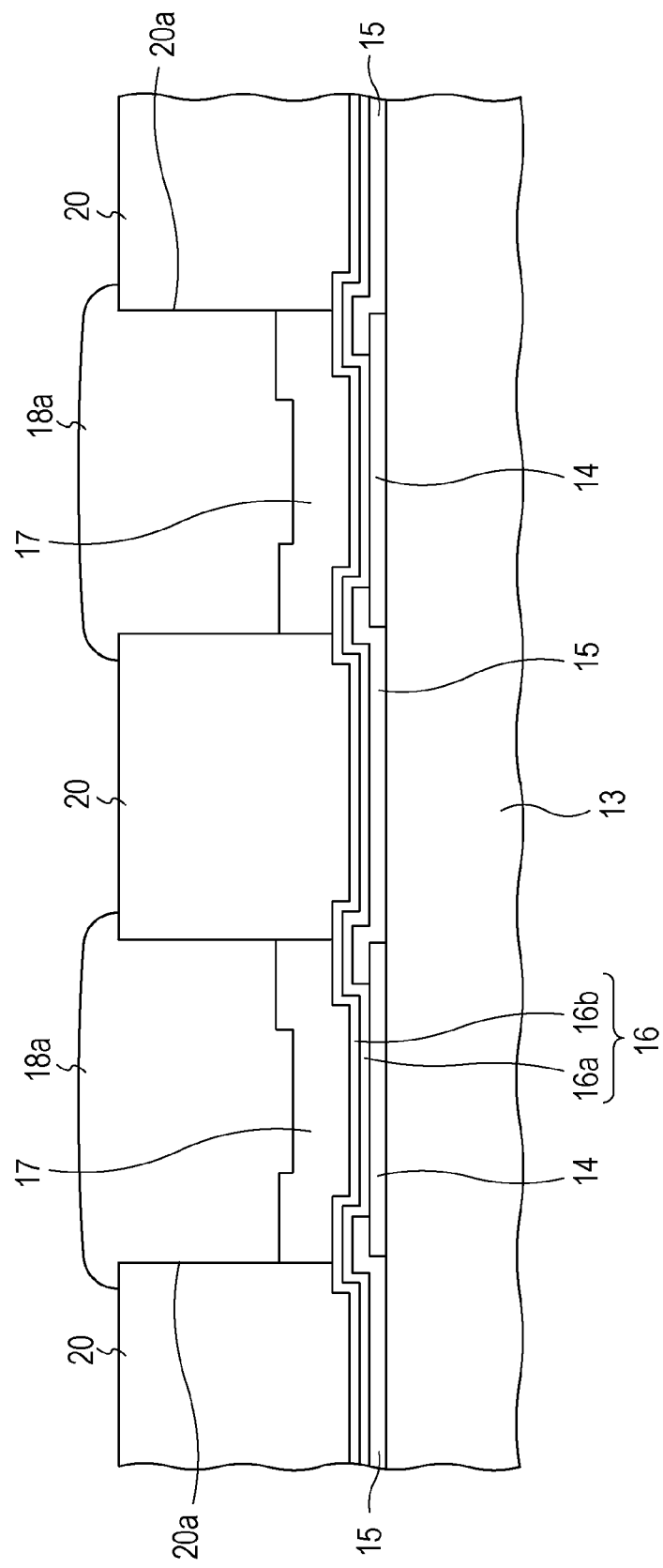

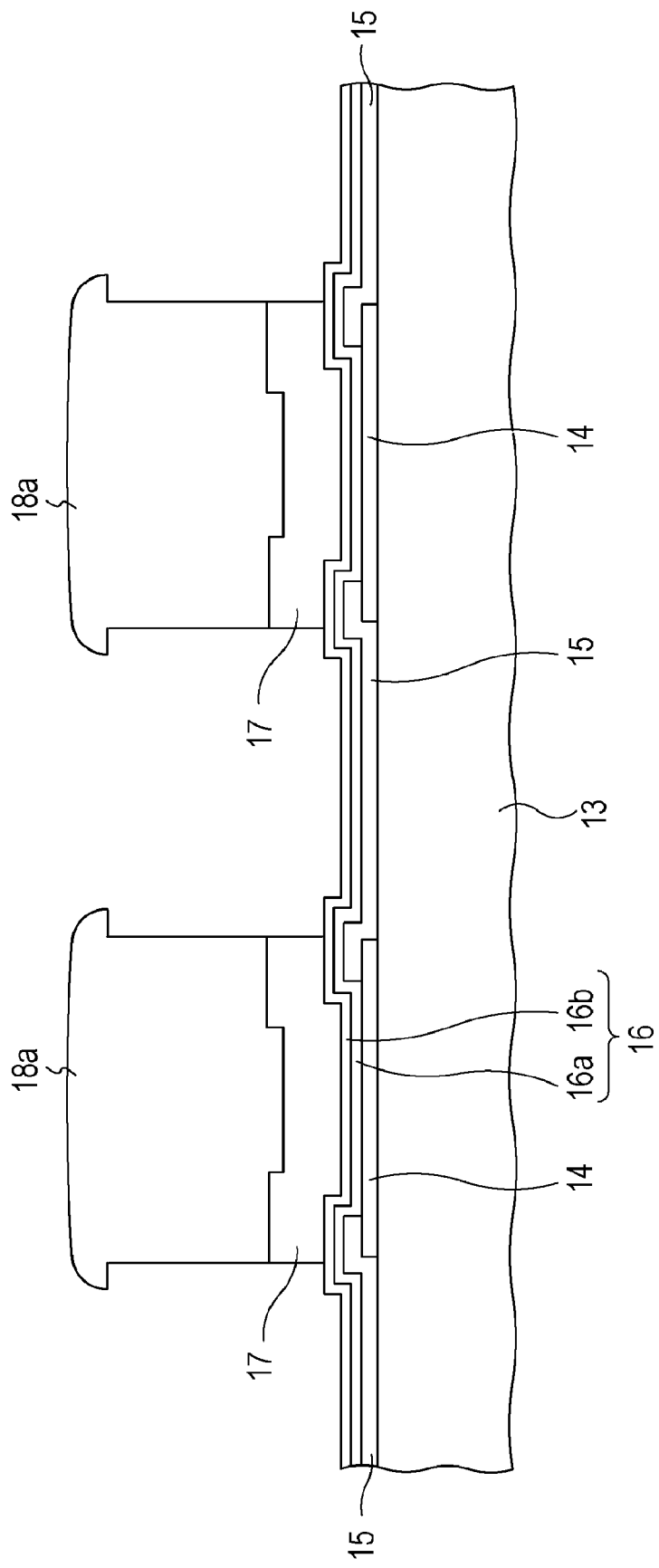

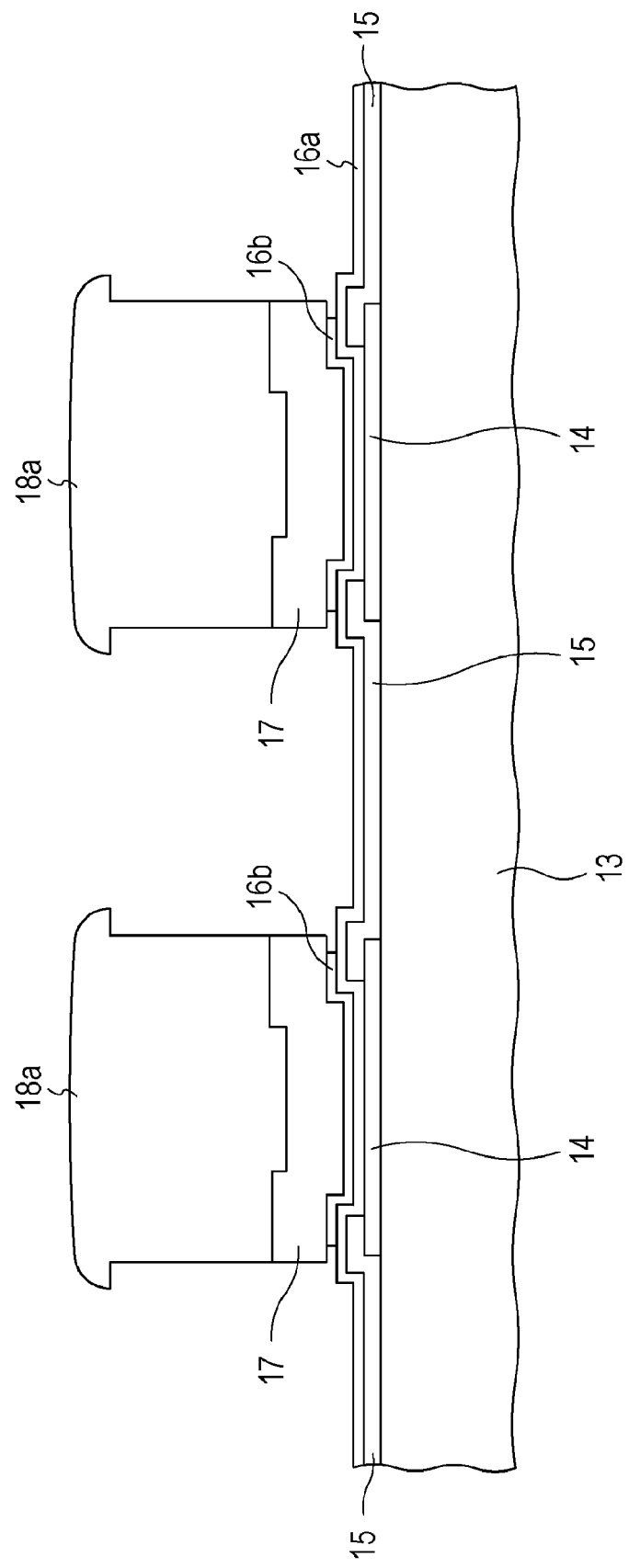

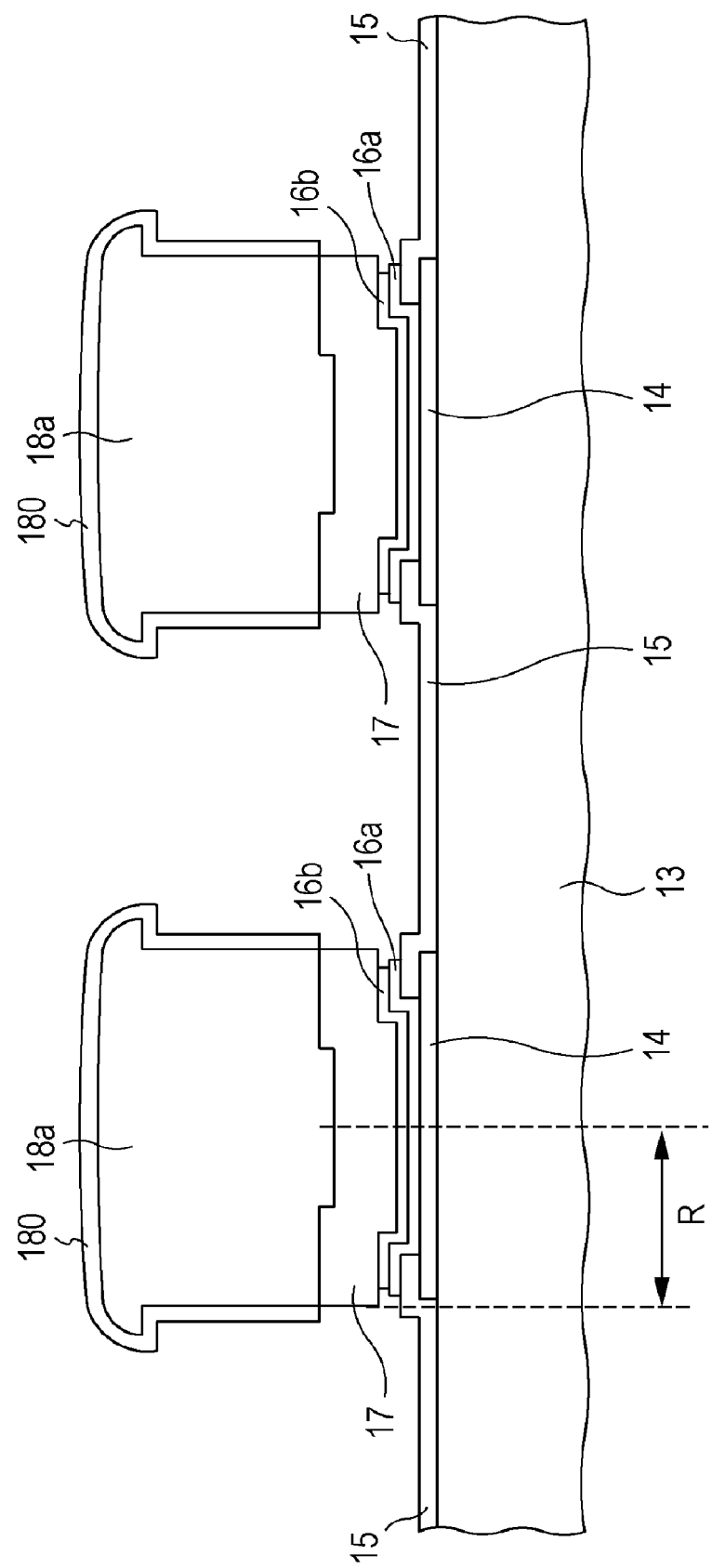

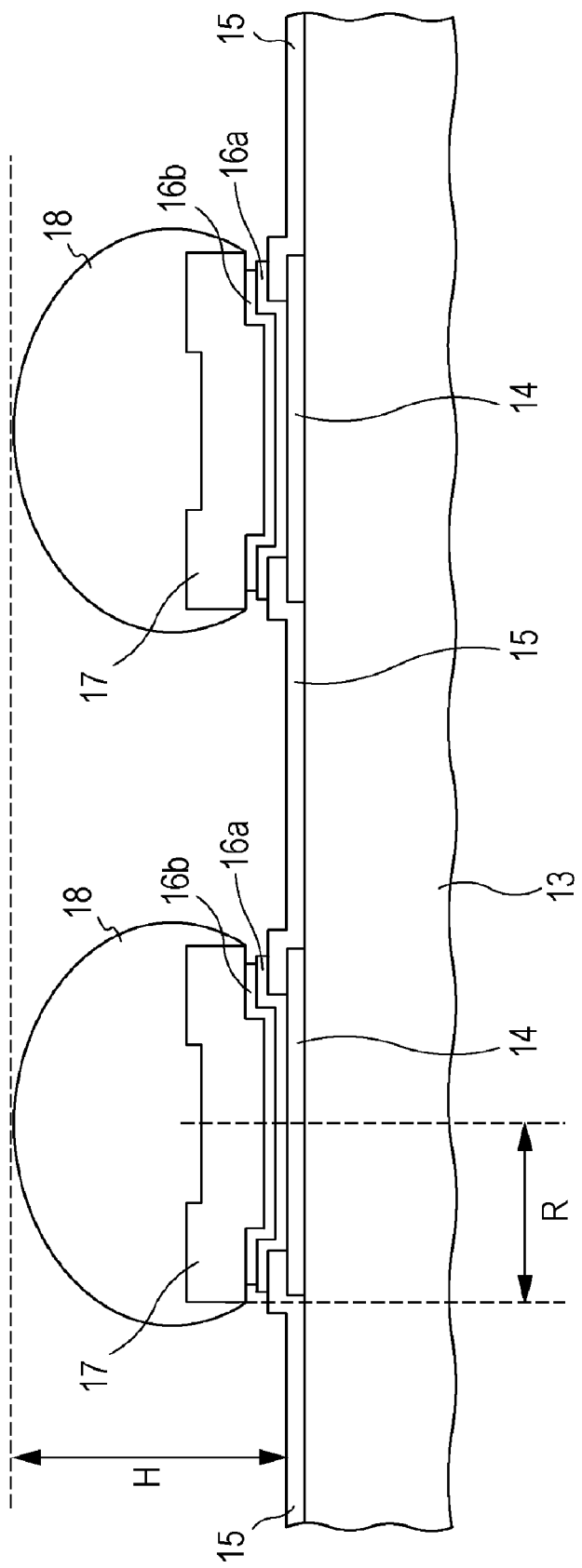

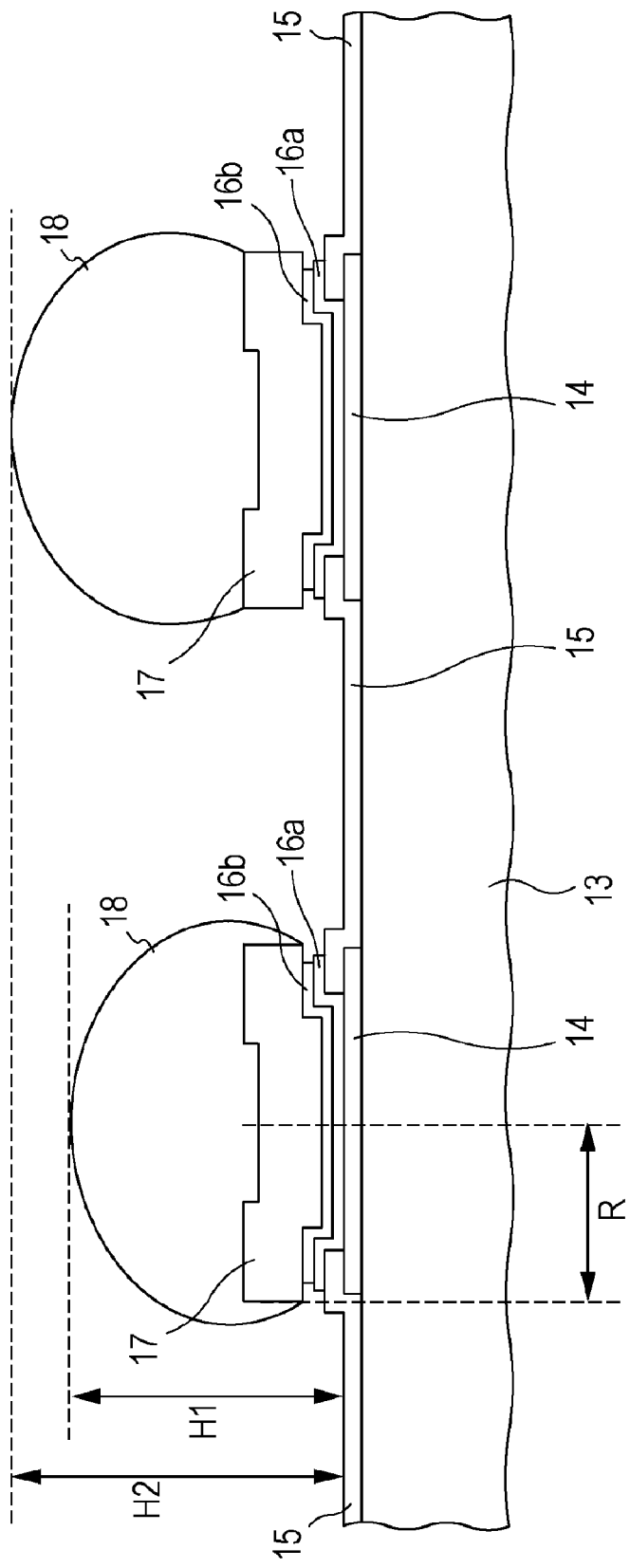

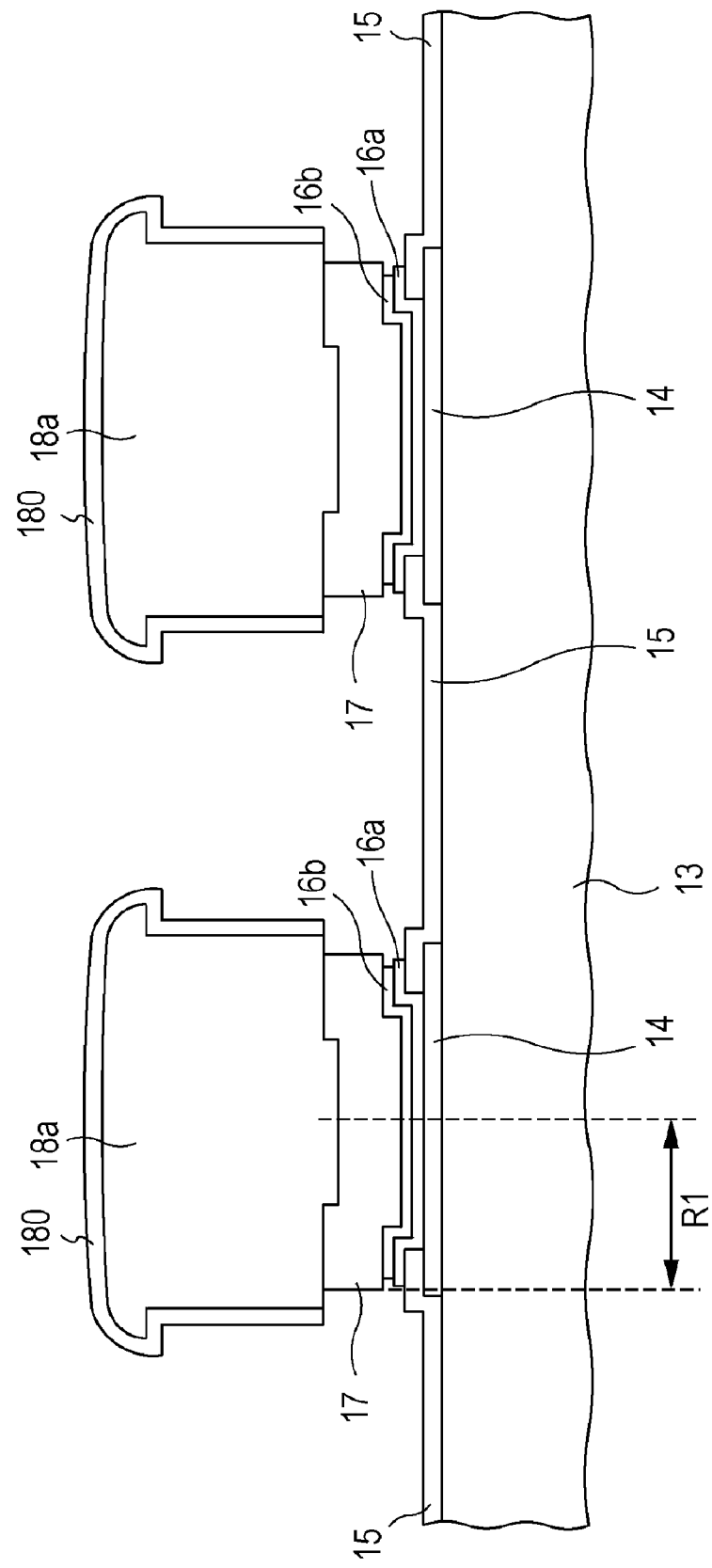

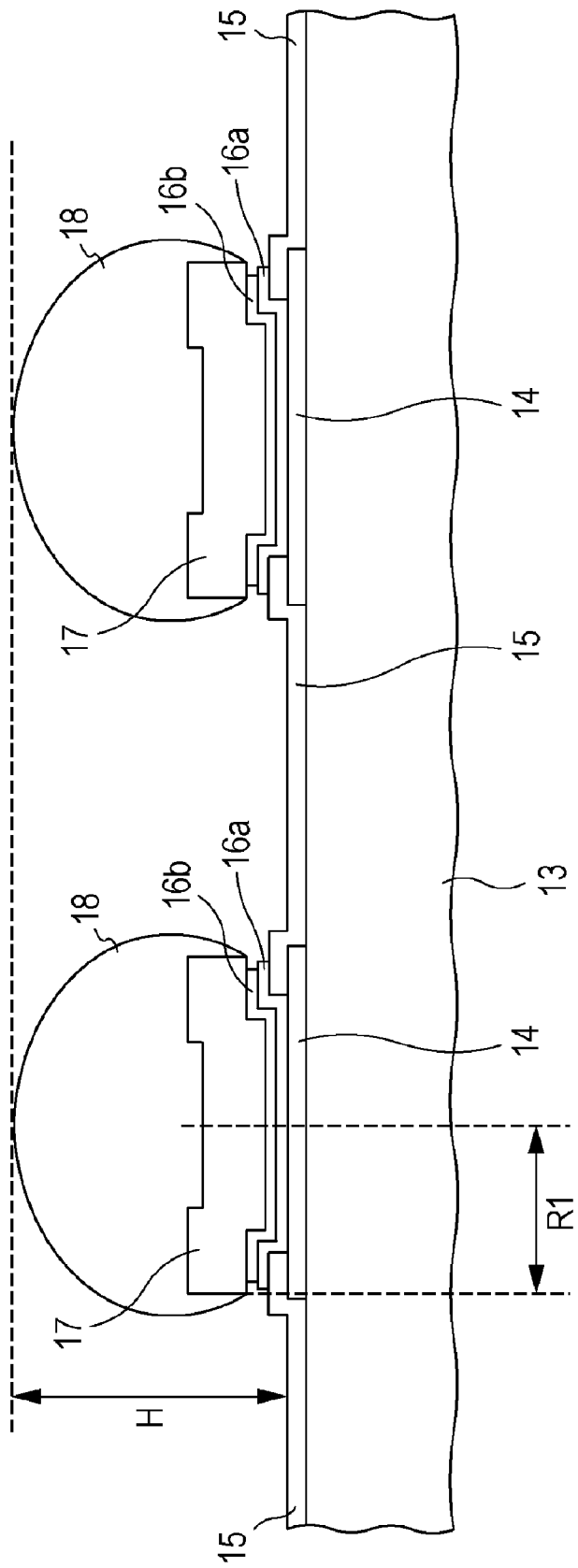

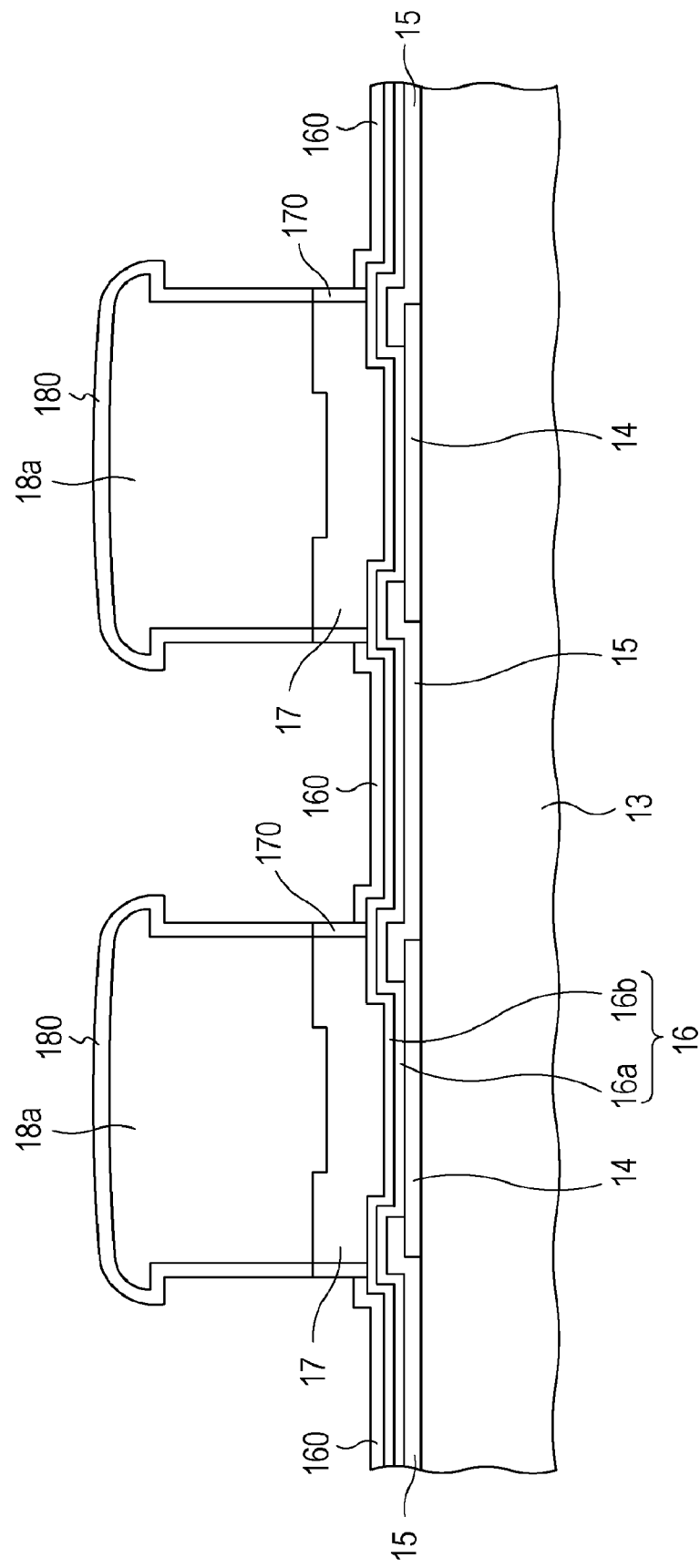

METHOD FOR MANUFACTURING SEMICONDUCTOR DEVICE HAVING ELECTRODE FOR EXTERNAL CONNECTION

CROSS-REFERENCE TO RELATED APPLICATIONS

This application is based upon and claims the benefit of priority of the prior Japanese Patent Application No. 2008-256154, filed on Oct. 1, 2008 the entire contents of which are incorporated herein by reference.

FIELD

The embodiments described herein generally relates to a method for manufacturing semiconductor device and, in particular, to a method for manufacturing a semiconductor device that has an electrode for external connection.

BACKGROUND

In a surface-mount-type semiconductor device, a plurality of electrode pads electrically connected to an internal circuit are disposed at the mounting-surface-side and the electrode pads are respectively electrically connected to bump electrodes. Usually, a barrier metal is provided between an electrode pad and a bump electrode to suppress reaction between and strengthen adhesion between the electrode pad and the bump electrode. A semiconductor device is mounted on a mounting board or the like via such bump electrodes disposed at the mounting-surface-side.

A method for manufacturing such bump electrodes has been suggested, which includes selectively depositing a barrier metal and a bump electrode material on electrode pads by sputtering, plating, or the like and melting the bump electrode material to obtain bump electrodes of a particular shape. Such a structure is disclosed in, for example, Japanese Laid-open Patent Publication Nos. 1997-199505, 1996-45941, and 2004-174538.

Existing semiconductor devices have had the following problem. That is, the height of the bump electrodes produced by the existing method inadvertently vary in some cases. The cause of such a height variation is presumably the difference in flowability between the bump electrode material and the material that makes up the periphery of the bumps, i.e., the difference in flowability caused by wettability. When the heights of the bump electrodes vary as such, failures such as poor connection between the device and the mounting substrate and an increase in resistance may occur.

In this respect, it has been difficult to form bump electrodes of uniform height on electrode pads by the existing methods for manufacturing semiconductor devices.

SUMMARY

A method for manufacturing semiconductor device which includes forming a first metal film over an electrode pad disposed on a substrate, forming a second metal film on the first metal film, forming a first oxide film on a surface of the first metal film and a second oxide film on a surface of the second metal film by oxidizing the surfaces of the first metal film and the second metal film, removing the first oxide film, and melting the second metal film after removing the first oxide film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 2C is a cross-sectional schematic diagram of the relevant part in a resist-forming step of the first embodiment;

FIG. 2D is a cross-sectional schematic diagram of the relevant part in a barrier metal-forming step of the first embodiment;

FIG. 2E is a cross-sectional schematic diagram of the relevant part in a bump electrode material forming step of the first embodiment;

FIG. 2F is a cross-sectional schematic diagram of the relevant part in a resist-removing step of the first embodiment;

FIG. 2G is a cross-sectional schematic diagram of the relevant part in a Cu film-removing step of the first embodiment;

FIG. 2J is a cross-sectional schematic diagram of the relevant part in an oxide film selective removal step of the first embodiment;

FIG. 2K is a cross-sectional schematic view of the relevant part in a reflow process step according to the first embodiment;

FIG. 3 is a cross-sectional schematic view of the relevant part in a reflow process step according to a comparative example;

FIG. 4A is a cross-sectional schematic view of a relevant part according to another example of the oxide film selective removal step of the first embodiment;

FIG. 4B is a cross-sectional schematic view of a relevant part according to another example of the reflow process step of the first embodiment;

FIG. 5A is a cross-sectional schematic view of a relevant part in a surface oxidation step of a second embodiment;

DESCRIPTION OF EMBODIMENTS

One example of a semiconductor device of this embodiment will now be described.

Figure 1:
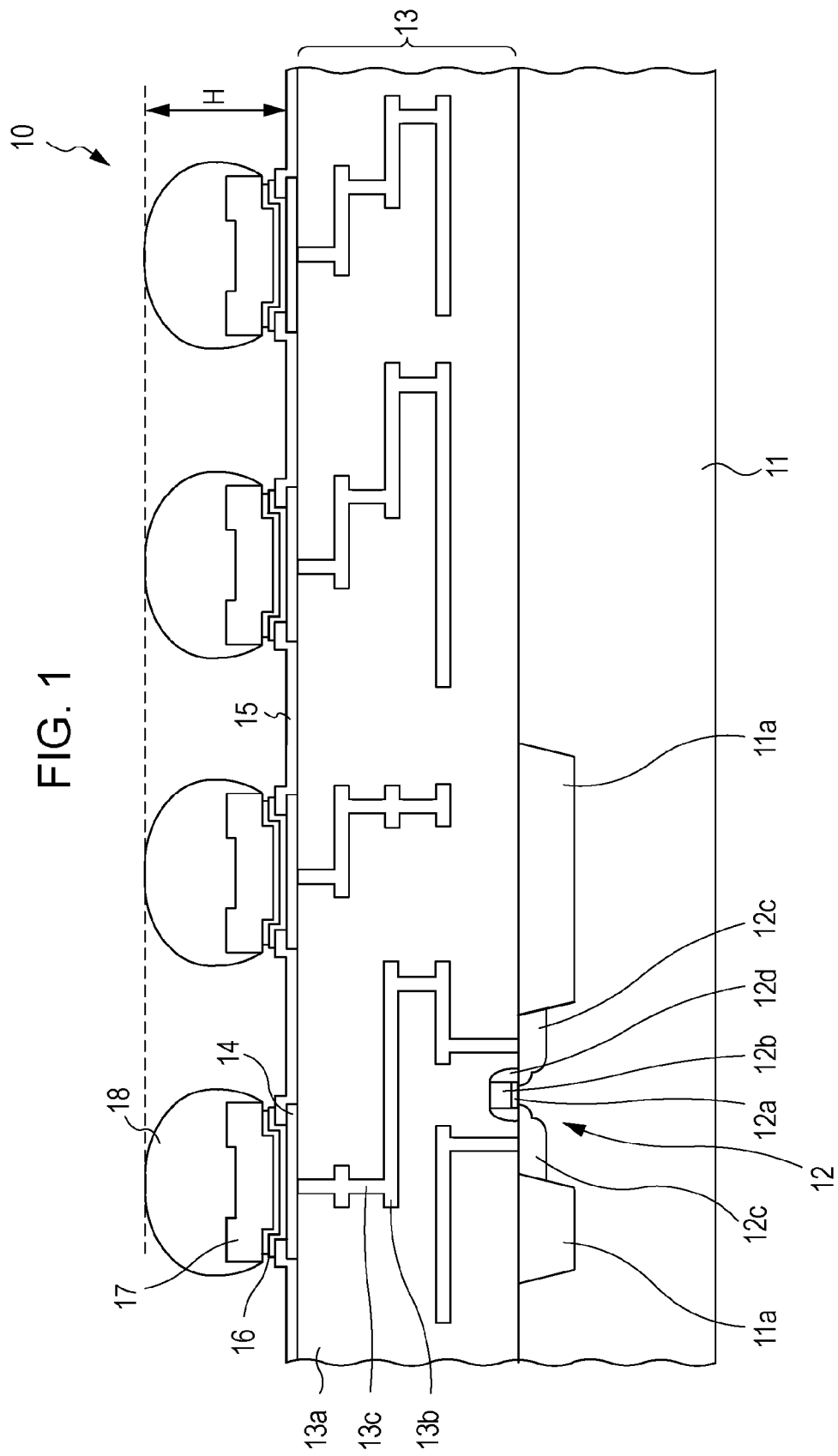
FIG. 1 is a partial cross-sectional view of one example of a semiconductor device.

FIG. 1 is a partial cross-sectional view of one example of a semiconductor device.

FIG. 1 schematically illustrates a part of a semiconductor device 10 of a flip-chip mounting type. As illustrated in FIG. 1, the semiconductor device 10 includes a semiconductor substrate 11 and a metal oxide semiconductor (MOS) transistor 12 in an element region defined by element isolation regions 11a formed in the substrate 11. For the purpose of convenience, only one MOS transistor 12 is illustrated in the drawing. Although not illustrated in the drawing, the semiconductor device 10 includes various other elements such as capacitor elements that constitute a circuit. The MOS transistor 12 given as an example has the following structure. That is, a gate electrode 12b is formed on a gate insulating film 12a, source and drain regions 12c are formed in the substrate 11 respectively at the two sides of the gate electrode 12b, and a side wall insulating film 12d is formed on a side wall of the gate electrode 12b.

The semiconductor device 10 that includes the MOS transistor 12 and other associated components also includes a wiring layer 13 on the substrate 11, an electrode pad 14, and a passivation film 15 having an opening that exposes part of the electrode pad 14. The electrode pad 14 is formed of aluminum (Al) or the like. The electrode pad 14 is electrically connected to an element such as the MOS transistor 12 via a wiring 13b and a via 13c embedded in an interlayer insulating film 13a of the wiring layer 13. A power supply layer 16, a barrier metal 17, and a bump electrode 18 are formed on the electrode pad 14. For the purposes of description, an external electrode that includes the electrode pad 14, the power supply layer 16, the barrier metal 17, the bump electrode 18, and the like is referred to as a "bump".

The power supply layer 16 is used as an electrode during formation of the materials for the barrier metal 17 and the bump electrode 18 by electroplating. In such a case, the power supply layer 16 is first formed as a layer covering the entire surface and the materials for the barrier metal 17 and the bump electrode 18 are selectively formed in a region overlying the electrode pad 14 by electroless plating. Then the exposed portions of the power supply layer 16 are removed so that the portion overlying the electrode pad 14 remains. The power supply layer 16 may have a single layer structure or a multilayer structure (in the drawing, a two-layer structure is illustrated). The power supply layer 16 may be composed of titanium (Ti) or copper (Cu), for example. The power supply layer 16 may be formed by sputtering, for example.

An example of forming the barrier metal 17 and the bump electrode 18 by electroplating using the power supply layer 16 is described below.

The barrier metal 17 is formed by, for example, electroplating using the power supply layer 16. Nickel (Ni) or a metal containing Ni as the main component is used as the material for the barrier metal 17. The barrier metal 17 assures conduction between the electrode pad 14 and the bump electrode 18 while preventing the reaction between materials of the electrode pad 14 and the bump electrode 18 caused by heat generated during manufacture or operation of the semiconductor device 10. The barrier metal 17 also has a function of securing the adhesion between the electrode pad 14 and the bump electrode 18. The diameter, thickness, and material of the barrier metal 17 are adequately set on the basis of the characteristics and operation environment of the semiconductor device 10, materials of the electrode pad 14 and the bump electrode 18, etc.

The bump electrode 18 is formed by, for example, electroplating using the power supply layer 16 described above. Examples of the material for the bump electrode 18 include tin silver (SnAg), lead tin (PbSn), tin (Sn), lead (Pb), a metal mainly composed of Sn and Ag, and a metal mainly composed of Sn and Pb. This metal material is first deposited on the barrier metal 17 and melted by a reflow process so that a bump electrode 18 having a semi-spherical shape as illustrated in FIG. 1 is obtained. The diameter, thickness (height), and material of the bump electrode 18 are adequately set on the basis of the characteristics and operation environment of the semiconductor device 10.

In general, a plurality of the semiconductor devices 10 having such a structure are formed on one substrate 11 and then separated into individual semiconductor devices 10 by a dicing process.

As a result of melting, all of the bump electrodes 18 illustrated in FIG. 1 cover the side surfaces of the barrier metals 17, and the heights H from the passivation film 15 are uniform. Thus, when the semiconductor device 10 is mounted on a mounting board or the like via the bump electrodes 18, failures such as poor connection between the device and the mounting substrate and an increase in resistance may be effectively suppressed.

A method for forming a semiconductor device 10 having bump electrodes 18 with a uniform height H described above will now be described in detail. In the description below, the structure under the electrode pad 14 is only briefly illustrated for the purposes of convenience.

A first embodiment is described first.

FIGS. 2A to 2K are cross-sectional views illustrating steps of forming a semiconductor device 10 of the first embodiment. The steps illustrated in FIGS. 2A to 2K are described step by step below. The step of forming the electrode pad 14 and the passivation film 15 and its subsequent steps are described here.

Figure 2A:
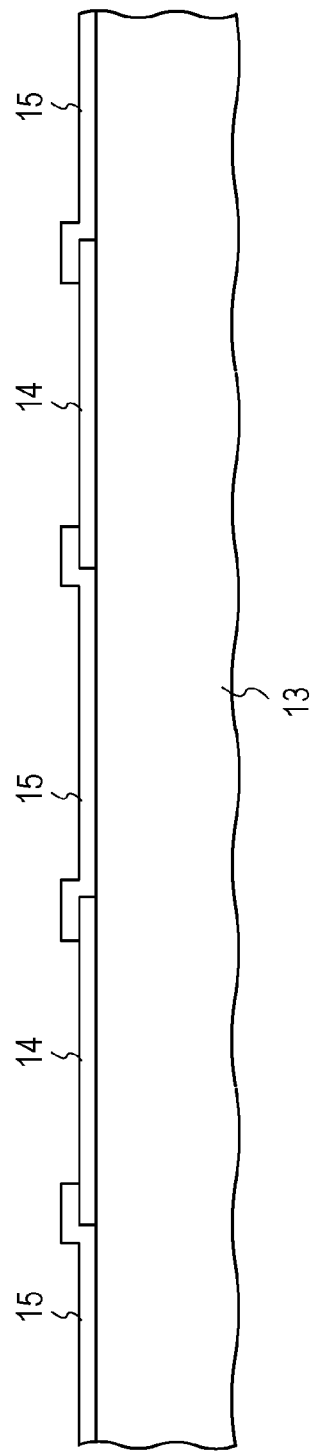
FIG. 2A is a cross-sectional schematic diagram of a relevant part after formation of electrode pads and a passivation film of the first embodiment.

FIG. 2A is a cross-sectional schematic diagram of a relevant part after formation of electrode pads and a passivation film of the first embodiment.

First, the electrode pads 14 are formed using Al or the like on the wiring layer 13 on a wafer. Then the passivation film 15 having openings that expose part of the electrode pads 14 is formed using a polyimide or the like.

Figure 2B:
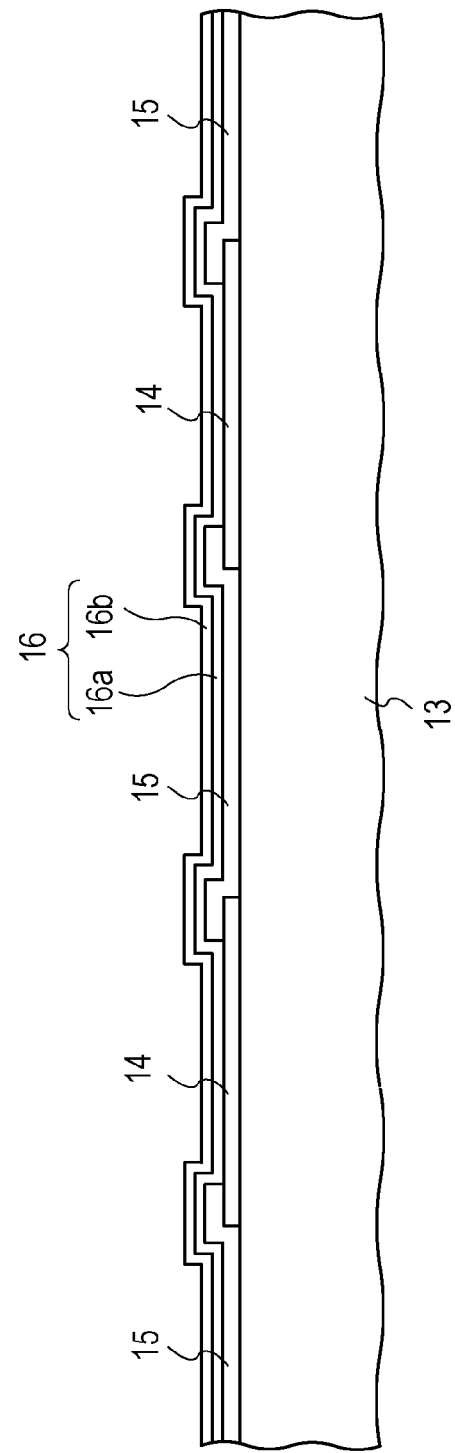
FIG. 2B is a cross-sectional schematic diagram of the relevant part in a power supply layer-forming step of the first embodiment.

FIG. 2B is a cross-sectional schematic diagram of the relevant part in a power supply layer-forming step of the first embodiment.

After formation of the electrode pads 14 and the passivation film 15, a Ti film 16a and a Cu film 16b are layered to serve as the power supply layer 16 used for electroplating. In particular, the Ti film 16a is formed over the entire surface by sputtering and then the Cu film 16b is formed on the Ti film 16a also by sputtering.

The thickness of the Ti film 16a and the Cu film 16b may be set on the basis of the amount of current during electroplating, adhesiveness, and the like. In this embodiment, the Ti film 16a and the Cu film 16b are each formed to a thickness of 100 nm to 300 nm.

The power supply layer 16 exhibits a higher resistance as its thickness decreases. Thus, when plating films of the same thickness are to be formed by electroplating, an electroplating process that uses a thin power supply layer 16 having a thickness of particular value or less requires either a higher voltage for plating or a longer plating time at the same voltage than an electroplating process that uses a thick power supply layer 16. However, increasing the voltage during the electroplating increases the risk of creating voids inside the plating film and the like. Extending the plating time without increasing the voltage is likely to result in a longer manufacture time and a higher production cost.

During electroplating, the peripheral portion of the wafer is used as the power supply position and the electrical current is supplied from the peripheral portion toward the center portion. Thus, during supply of the electrical current, the resistance increases from the peripheral portion of the wafer to the central portion of the wafer. If the power supply layer 16 has a thickness of a particular level or less, not enough electrical current reaches the center portion in some cases. If this happens, the thickness of the plating film in the wafer center portion becomes smaller than that in the peripheral portion, thereby creating a thickness variation in the plating film in the plane of the wafer.

In view of the above, the power supply layer 16 is preferably formed to have a particular thickness considering the quality of the plating film, the production efficiency and cost, the thickness distribution of the plating film in the plane of the wafer, etc.

FIG. 2C is a cross-sectional schematic diagram of the relevant part in a resist-forming step of the first embodiment.

After the Ti film 16a and the Cu film 16b which constitute the power supply layer 16 are formed, a resist 20 is applied on the entire surface of the power supply layer 16. Openings 20a are photolithographically formed in regions where the bump electrodes 18 are to be formed (regions respectively corresponding to the electrode pads 14).

FIG. 2D is a cross-sectional schematic diagram of the relevant part in a barrier metal-forming step of the first embodiment.

After the openings 20a are formed, an Ni film serving as the barrier metal 17 is formed on the power supply layer 16 in each opening 20a by electroplating using the power supply layer 16 previously formed.

The thickness of the barrier metal 17 may be set on the basis of the diffusibility of the material of the subsequently formed bump electrode 18 into the barrier metal 17 and the like. For example, in the case where an Ni film is formed as the barrier metal 17 and the bump electrode 18 is formed of SnAg containing Sn as the main component, the thickness of the Ni film may be set to about 3 µm.

When the power supply layer 16 is formed to a particular thickness as described above, the barrier metal 17 with no voids or the like may be formed while suppressing the thickness variation in the plane of the wafer. The thickness variation of the barrier metal 17 causes a thickness variation of the material for the bump electrode 18 (bump electrode material) subsequently formed by electroplating. This may cause a variation in the height H of the bump electrodes 18 ultimately obtained.

FIG. 2E is a cross-sectional schematic diagram of the relevant part in a bump electrode material forming step of the first embodiment.

After the barrier metals 17 are formed in the openings 20a, a bump electrode material 18a is formed on each barrier metal 17 by electroplating using the power supply layer 16. Here, SnAg (Ag: about 2.5 wt %) is used as the bump electrode material 18a.

The thickness of the bump electrode material 18a may be set on the basis of the height H of the bump electrode 18 after a reflow process performed later.

Note that when the power supply layer 16 is formed to have a particular thickness and the barrier metals 17 are formed while suppressing the thickness variation in the plane of the wafer, the bump electrode materials 18a may be formed to have a particular volume while suppressing the thickness variation.

FIG. 2F is a cross-sectional schematic diagram of the relevant part in a resist-removing step of the first embodiment.

After the bump electrode material 18a is formed, the resist 20 which has been used as a mask for electroplating is removed by ashing, dissolution with a chemical, or the like.

As a result, a multilayer film including a barrier metal 17 and a bump electrode material 18a remains on the top of each electrode pad 14, while being separated from the electrode pad 14 by the power supply layer 16 covering the entire surface of the wafer.

FIG. 2G is a cross-sectional schematic diagram of the relevant part in a Cu film-removing step of the first embodiment.

After the resist 20 is removed, the Cu film 16b exposed in the surface is selectively removed by wet etching. A solution containing particular concentrations of hydrogen peroxide and acetic acid (such as an aqueous solution containing hydrogen peroxide and acetic acid) may be used as the etchant, for example.

Figure 2H:
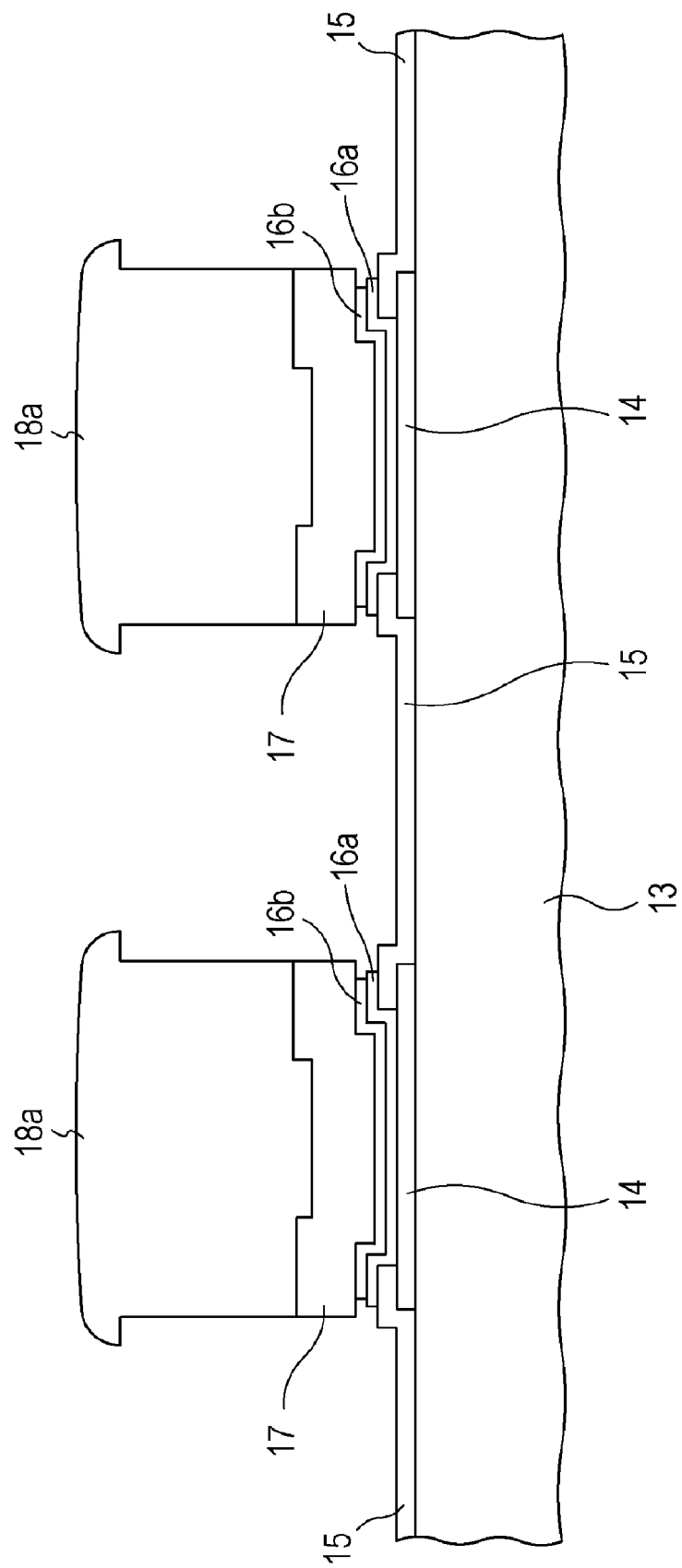
FIG. 2H is a cross-sectional schematic view of the relevant part in a Ti film-removing step of the first embodiment.

FIG. 2H is a cross-sectional schematic view of the relevant part in a Ti film-removing step of the first embodiment.

After the Cu film 16b is etched, the Ti film 16a thereby exposed in the surface is selectively removed by wet etching. A solution containing a particular concentration of hydrogen fluoride (hydrofluoric acid), such as an aqueous hydrofluoric acid solution, may be used as the etchant.

During etching of the Cu film 16b and the Ti film 16a illustrated in FIGS. 2G and 2H, edges of the Cu film 16b and the Ti film 16a directly below the barrier metals 17 are also etched (side etching). Excessive side etching of the Cu film 16b and the Ti film 16a may result in failures such as decreased adhesion among the electrode pad 14, the barrier metal 17, and the bump electrode material 18a. In this regard, the etching conditions (the etchant concentration, etching time, etc.) are preferably optimized to prevent excessive side etching during etching of the Cu film 16b and the Ti film 16a.

Figure 2I:
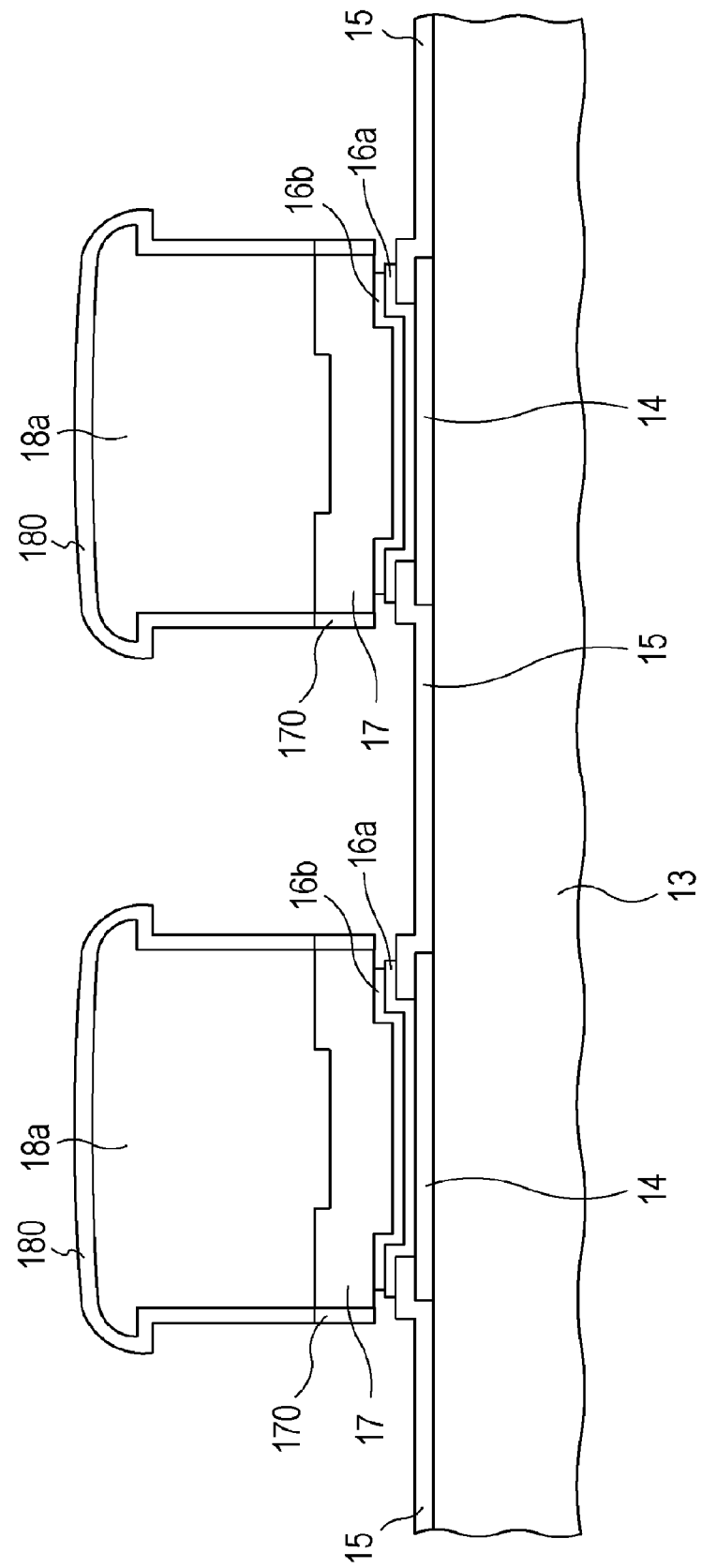
FIG. 2I is a cross-sectional schematic view of the relevant part in a surface oxidation treatment step of the first embodiment.

FIG. 2I is a cross-sectional schematic view of the relevant part in a surface oxidation treatment step of the first embodiment.

After the Cu film 16b and the Ti film 16a are removed in that order, heat treatment is conducted at a temperature lower than the melting points of the barrier metals 17 and the bump electrode material 18a in an oxidizing atmosphere. For example, heat treatment is conducted in air at 150° C. for 30 minutes.

As a result of such heat treatment, at least the SnAg surfaces of the bump electrode materials 18a and the Ni surfaces of the barrier metals 17 are oxidized among the metals exposed in the surface. Oxide films 180 are thereby formed on the SnAg surfaces of the bump electrode materials 18a and oxide films 170 are formed on the Ni surfaces of the barrier metals 17.

FIG. 2J is a cross-sectional schematic diagram of the relevant part in an oxide film selective removal step of the first embodiment.

After the oxide films 180 and the oxide films 170 are respectively formed on the SnAg surfaces of the bump electrode materials 18a and the Ni surfaces of the barrier metals 17, the oxide films 170 formed on the Ni surfaces of the barrier metals 17 are selectively removed by wet etching. For example, a solution containing particular concentrations of hydrogen peroxide and sulfuric acid (such as an aqueous solution containing hydrogen peroxide and sulfuric acid) may be used as the etchant.

For example, the oxide films 170 are selectively removed by wet etching with a solution (aqueous solution) having a hydrogen peroxide concentration of about 1.5% and a sulfuric acid concentration of about 3% as the etchant at a temperature of about 30° C. for about 100 seconds.

The etching rates of SnAg, Ni, and oxides formed on the SnAg and Ni surfaces for etchants are illustrated in Table 1.

TABLE 1

|  | Etching rate of SnAg | Etching rate of SnAg surface oxide | Etching rate of Ni | Etching rate of Ni surface oxide |
|---|---|---|---|---|
| Hydrogen peroxide + acetic acid | Low | Low | Low | Low |
| Hydrogen peroxide + sulfuric acid | High | Low | High | High |

Table 1 illustrates that when a solution containing particular concentrations of hydrogen peroxide and acetic acid is used as the etchant, SnAg, Ni, and the oxides formed on the SnAg and Ni surfaces all exhibit a low etching rate and are not easily dissolved by the etchant.

When a solution containing particular concentrations of hydrogen peroxide and sulfuric acid is used as the etchant, SnAg, Ni, and the oxide formed on the Ni surface exhibit high etching rates for the etchant. The etching rate of SnAg is particularly high. In contrast, the oxide formed on the SnAg surface exhibits a low etching rate also for the solution containing hydrogen peroxide and sulfuric acid and is not easily dissolved by the solution.

The bump electrode materials 18a may be protected by the oxide films 180 and the oxide films 170 on the barrier metals 17 may be selectively removed as illustrated in FIG. 2J when a solution containing particular concentrations of hydrogen peroxide and sulfuric acid is used to remove the oxide films 170 on the surfaces of the barrier metals 17. After the oxide films 170 are removed as such, nickel of the barrier metals 17 becomes exposed to the outside from the side surface of the barrier metal 17 of each bump. Here, the surface condition of each bump is uniform and has no variation. It should be noted that although the side surfaces of the barrier metals 17 are preferably completely exposed (clean surface condition), small amounts of the oxide films 170 may remain on the side surfaces.

FIG. 2K is a cross-sectional schematic view of the relevant part in a reflow process step according to the first embodiment.

After the oxide films 170 on the barrier metals 17 are removed, the bump electrode materials 18a are subjected to a reflow process. The reflow process is conducted in a reducing gas atmosphere at a temperature exceeding the melting temperature of the bump electrode materials 18a. As a result of the reflow process, the oxide films 180 on the bump electrode materials 18a are reduced with the reducing gas and the bump electrode materials 18a melt.

As mentioned above, uniform and clean Ni surfaces are exposed at the side surfaces of the barrier metals 17 by wet etching illustrated in FIG. 2J; hence, the melted bump electrode materials 18a exhibit the same wettability for all side surfaces of the barrier metals 17. Thus, the bump electrode materials 18a are all melted by the reflow process and deformed to cover the side surfaces of the barrier metals 17. As a result, bump electrodes 18 covering the side surfaces of the barrier metals 17 are formed as illustrated in FIG. 2K.

As described above, in the first embodiment, the barrier metals 17 and the bump electrode materials 18a are formed in the openings 20a of the resist 20 by electroplating using the power supply layer 16, and then the resist 20 is removed as well as the underlying portions of the Cu film 16b and the Ti film 16a of the power supply layer 16. A surface oxidation treatment is conducted to form oxide films 170 and 180 on the barrier metals 17 and the bump electrode materials 18a, respectively, and the oxide films 170 on the barrier metals 17 are selectively removed to expose the Ni surfaces having the same surface condition, followed by a reflow process.

In this manner, the bump electrodes 18 covering the side surfaces of the barrier metals 17 may be stably formed. Moreover, the bump electrode materials 18a before melting may be formed to have a particular volume, and the heights H of the bump electrodes 18 on the electrode pads 14 may be highly accurately uniform.

In contrast, in the case where a reflow process is conducted without a surface oxidation treatment after formation of the barrier metals 17 and the bump electrode materials 18a, removal of the resist 20, and removal of the Cu film 16b and the Ti film 16a, the heights of the bump electrodes 18 may vary.

FIG. 3 is a cross-sectional schematic view of the relevant part in a reflow process step according to a comparative example.

After the barrier metals 17 and the bump electrode materials 18a are formed (FIG. 2E), the side surfaces of the barrier metals 17 are exposed to air, chemicals, pure water, etc., and oxidized during removal of the resist 20 (FIG. 2F) and the Cu film 16b and the Ti film 16a (FIGS. 2G and 2H). However, the oxidation states of the side surfaces of the barrier metals 17 are not always uniform.

Because the oxidation state of the side surfaces of the barrier metals 17 is not uniform, the bump electrode materials 18a wet some of the side surfaces of the barrier metals 17 but leave other side surfaces unwet during the reflow process. In other words, some side surfaces of the barrier metals 17 may be covered with the bump electrode materials 18a but others may remain uncovered. If this occurs, although the bump electrode materials 18a before the reflow process are each formed to have a particular volume, the resulting bump electrodes 18 have different heights H1 and H2 as illustrated in FIG. 3. For example, in the case of relatively small bump electrodes 18 such as those having a diameter of about 30 μm and a height of about 15 μm to 20 μm, the difference between the heights H1 and H2 may be as much as about 3 μm and may cause failures such as poor connection between the bump and the mounting substrate and the like and an increase in resistance.

In contrast, according to the first embodiment, the reflow process is conducted after the surface oxidation treatment has been conducted while exposing the barrier metals 17 and the bump electrode materials 18a and the oxide films 170 on the barrier metals 17 have been removed to expose the Ni surfaces having the same surface condition. As a result, the bump electrode materials 18a having a particular volume melt to cover the side surfaces of the barrier metals 17 and the bump electrodes 18 having a uniform height H are formed.

As described above, according to the method of the first embodiment, the heights H of the bump electrodes 18 may be made uniform and a semiconductor device 10 that may form highly reliable interconnections with the mounting board and the like may be obtained.

Although the oxide films 170 on the surfaces of the barrier metals 17 are removed to obtain Ni surfaces of the same surface condition in the first embodiment, it is also possible to obtain Ni surfaces of the same conditions by removing the oxide films 170 and part of the barrier metals 17.

FIG. 4A is a cross-sectional schematic view of a relevant part according to another example of the oxide film selective removal step of the first embodiment. FIG. 4B is a cross-sectional schematic view of a relevant part according to another example of the reflow process step of the first embodiment.

After the oxide films 180 and the oxide films 170 are respectively formed on the surfaces of the bump electrode materials 18a and the barrier metals 17 by the surface oxidation treatment as illustrated in FIG. 2I, the oxide films 170 are selectively removed by wet etching using a solution containing particular concentrations of hydrogen peroxide and sulfuric acid. The solution containing particular concentrations of hydrogen peroxide and sulfuric acid may dissolve the oxide films 170 on the Ni surfaces of the barrier metals 17 and Ni, as illustrated in Table 1.

For example, in order to selectively remove the oxide films 170 and part of the barrier metals 17, wet etching is performed using, as an etchant, a solution (e.g., an aqueous solution) having a hydrogen peroxide concentration of about 1.5% and a sulfuric acid concentration of about 3%, at a temperature of about 30° C. for about 100 seconds or more until desired amounts of the barrier metals 17 are etched away.

The solution containing hydrogen peroxide and sulfuric acid may remove the oxide films 170 and part of the barrier metals 17 as illustrated in FIG. 4A and may expose Ni surfaces of the same surface condition at the side surfaces of the barrier metals 17. When the Ni surfaces are exposed in this manner, the radius R of the barrier metal 17 illustrated in FIG. 2J may be decreased to a radius R1 (<R) as illustrated in FIG. 4A. For example, the radius of the barrier metal 17 may be controlled to be about 2 μm smaller than the radius of the bump electrode material 18a so that the bump electrode material 18a overhangs on the barrier metal 17. Note that the diameter of the barrier metal 17 to be reduced may be controlled by controlling the etchant concentration, the etchant exposure time, and the like.

In the case where the Ni surfaces of the same surface condition are exposed at the side surfaces of the barrier metals 17 and the diameters of the barrier metals 17 are decreased, the molten bump electrode materials 18a more easily flow toward the side surfaces of the barrier metals 17 after the reflow process for structural reasons. Thus, the bump electrodes 18 that cover the side surfaces of the barrier metals 17 and have a uniform height H may be reliably formed as illustrated in FIG. 4B.

According to the above-mentioned method of performing a reflow process without conducting a surface oxidation treatment, not only is it difficult to make the heights H of the bump electrode 18 uniform, but also it is difficult to decrease the diameter of the barrier metals 17. For example, if wet etching is conducted using a solution containing hydrogen peroxide and sulfuric acid illustrated in Table 1 before the reflow process (after removal of the Cu film 16b and the Ti film 16a illustrated in FIGS. 2G and 2H), the solution easily dissolves SnAg of the bump electrode materials 18a. In contrast, if the solution containing hydrogen peroxide and acetic acid illustrated in Table 1 is used, dissolution of SnAg of the exposed bump electrode materials 18a may be suppressed. However, as illustrated in Table 1, this solution has a low etching rate for Ni and the oxide at the Ni surfaces and does not easily dissolve Ni or the oxide. Reducing the diameter of the barrier metals 17 using this solution is thus difficult.

In contrast, according to the method including the surface oxidation treatment, a solution containing hydrogen peroxide and sulfuric acid is used after the surface oxidation treatment to selectively remove the oxide films 170 on the Ni surfaces of the barrier metals 17 while protecting SnAg of the bump electrode materials 18a with the oxide films 180 on their surfaces. In addition, part of the barrier metals 17 are removed to decrease the diameter. In this manner, the diameter of each barrier metal 17 may be reduced, the Ni surfaces of the same surface condition may be exposed, and bump electrodes 18 having a uniform height H may be reliably produced.

A second embodiment will now be described.

A process of forming the semiconductor device 10 according to the second embodiment is described below step by step. In the second embodiment, the steps up to the step of removing the resist 20 illustrated in FIG. 2F are the same as in the first embodiment. The steps subsequent to the step of removing the resist 20 are described below.

In the second embodiment, a surface oxidation treatment is conducted after removing the resist 20 illustrated in FIG. 2F.

FIG. 5A is a cross-sectional schematic view of a relevant part in a surface oxidation step of the second embodiment.

After the resist 20 is removed, heat treatment in an oxidizing gas atmosphere is conducted while exposing the Cu film 16b of the power supply layer 16, the barrier metals 17, and the bump electrode materials 18a. For example, heat treatment is conducted at 150° C. in air for 30 minutes. As a result, the oxide films 180 and the oxide films 170 are respectively formed on SnAg surfaces of the bump electrode materials 18a and the Ni surfaces of the barrier metals 17, and oxide films 160 are formed on the Cu surface of the Cu film 16b.

Figure 5B:
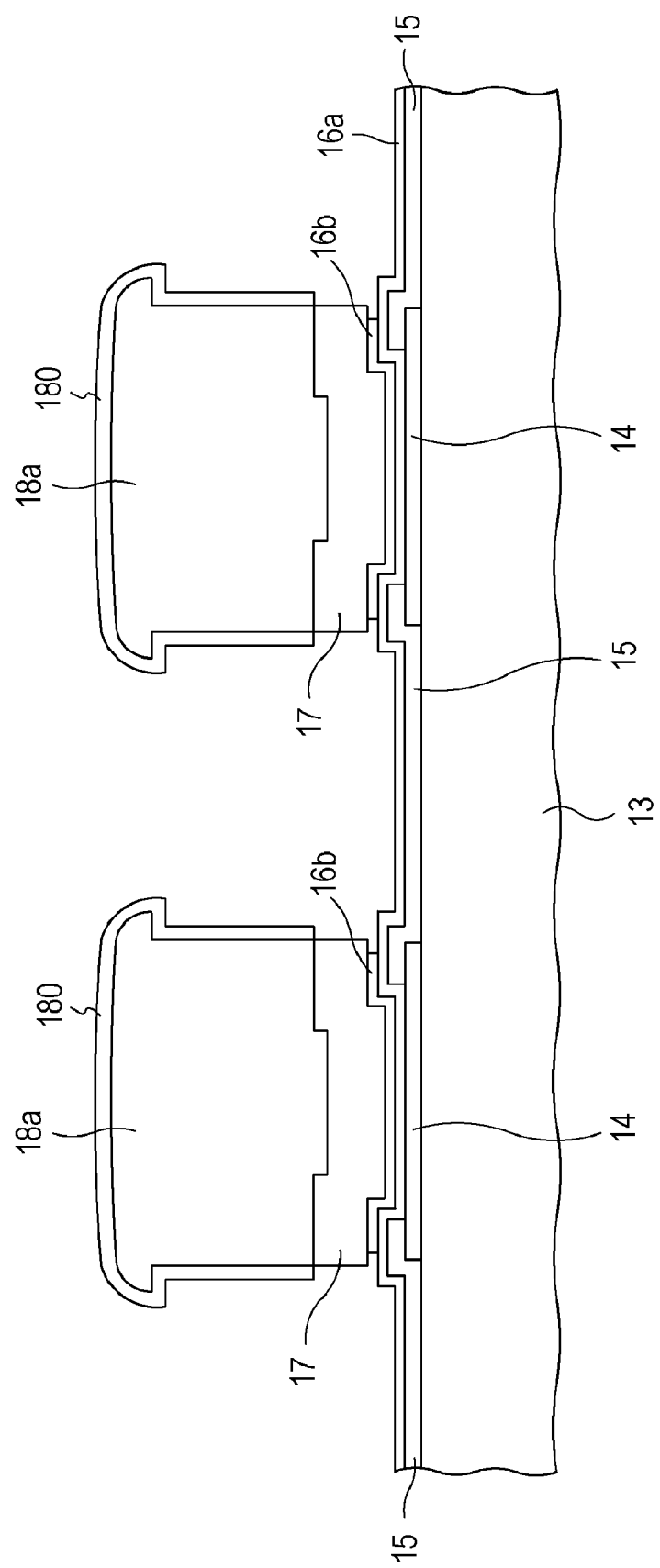
FIG. 5B is a cross-sectional schematic view of the relevant part in a step of selectively removing a Cu film and oxide films of the second embodiment.

FIG. 5B is a cross-sectional schematic view of the relevant part in a step of selectively removing the Cu film and the oxide films of the second embodiment. After forming the oxide films 160, 170, and 180 by the surface oxidation treatment, wet etching is conducted by using a solution containing particular concentrations of hydrogen peroxide and sulfuric acid (such as an aqueous solution containing hydrogen peroxide and sulfuric acid). When such a solution is used as the etchant, the oxide films 170 on the surfaces of the barrier metals 17, the oxide films 160 on the surfaces of the Cu film 16b, and part of the Cu film 16b may be removed.

For example, in order to selectively remove the oxide films 170, the oxide film 160 on the surface of the Cu film 16b, and part of the Cu film 16b, a solution (aqueous solution) having a hydrogen peroxide concentration of about 1.5% and a sulfuric acid concentration of about 3% is used as the etchant and wet etching is conducted at a temperature of about 30° C. for about 100 seconds or more under the time condition at which the Cu film 16b is removed to a desired state.

After the oxide films 170 are removed by wet etching, the Ni surfaces of the same surface condition are exposed in the side surfaces of the barrier metals 17. The bump electrode materials 18a are protected from the etchant by the oxide films 180 on the surface.

Figure 5C:
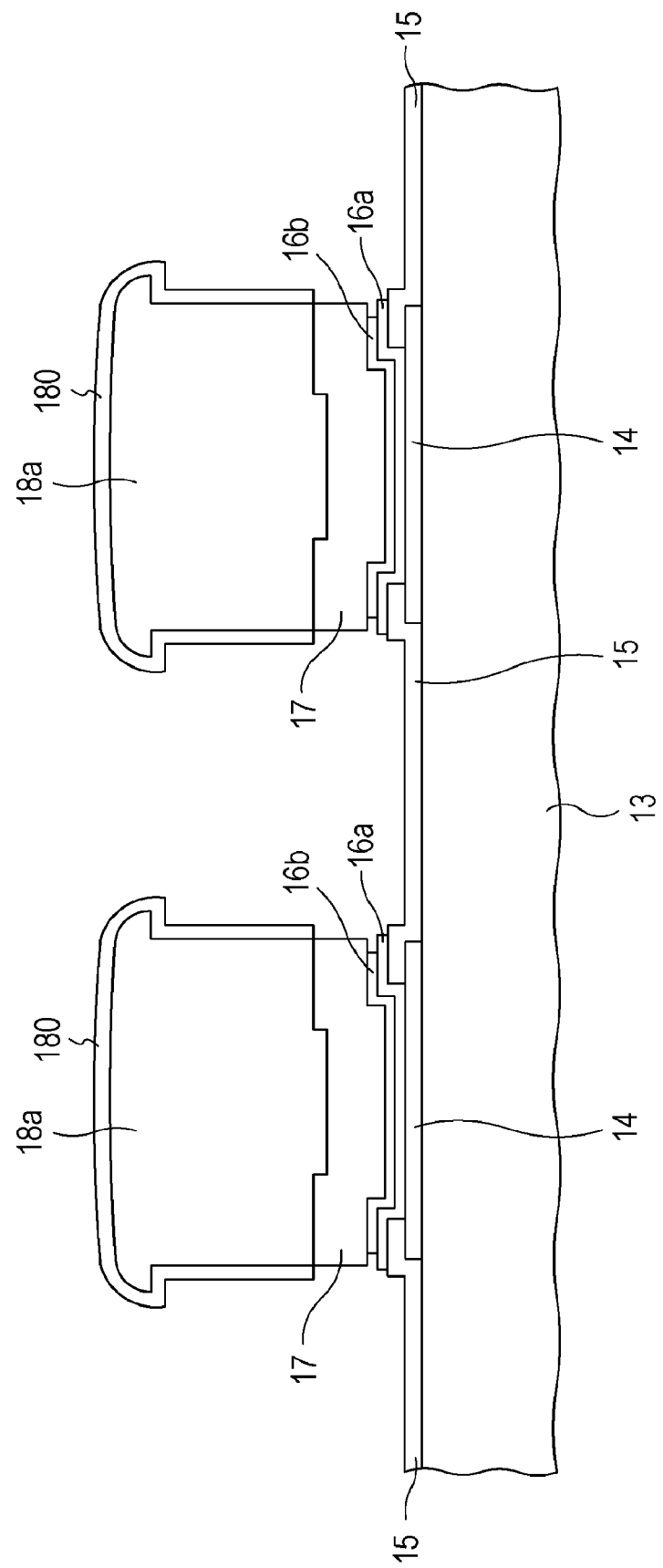
FIG. 5C is a cross-sectional schematic diagram of the relevant part in a Ti film removing step of the second embodiment.

FIG. 5C is a cross-sectional schematic diagram of the relevant part in a Ti film removing step of the second embodiment.

After the oxide films 170 and 160 and the Cu film 16b are removed as illustrated in FIG. 5B, the Ti film 16a thereby exposed in the surface is selectively removed by wet etching using a solution containing a particular concentration of hydrofluoric acid (such as an aqueous hydrofluoric acid solution). During this step also, the bump electrode materials 18a are protected from the etchant by the oxide films 180 on the surfaces.

After the steps up to the removal of the Ti film 16a are performed, a reflow process is conducted as in the first embodiment at a temperature exceeding the melting point of the bump electrode materials 18a in a reducing gas atmosphere. After removal of the oxide films 170, only the step of removing the Ti film 16a is performed before the reflow process. Therefore, as illustrated in FIG. 2K, bump electrodes 18 having a uniform height H and covering the side surfaces of the barrier metals 17 may be formed.

In the second embodiment, since the oxide films 170 on the surfaces of the barrier metals 17 and the Cu film 16b are removed in the same step, the number of steps may be decreased.

Note that in removing the oxide films 170 on the surfaces of the barrier metals 17 as illustrated in FIG. 5B, the concentration of the etchant and the time for exposure to the etchant may be adjusted to remove the oxide films 170 and part of the barrier metals 17 to decrease the diameter of each barrier metal 17 as illustrated in FIG. 4A. When the diameter of the barrier metal 17 is decreased, the molten bump electrode material 18a easily flows toward the side surface of the barrier metal 17, and bump electrodes 18 with a uniform height H and covering the side surfaces of the barrier metals 17 may be reliably obtained.

The methods of the first and second embodiments described above are applicable to formation of semiconductor devices of various forms and bump electrodes of various sizes.

In the description above, a solution containing particular concentrations of hydrogen peroxide and sulfuric acid is cited as an example of a solution for selectively removing the oxide films 170 on the surfaces of the barrier metal 17 over the oxide films 180 on the surfaces of the bump electrode materials 18a. Any other solution that has a higher etching rate for the oxide films 170 than for the oxide films 180 is also applicable. For example, a solution containing different concentrations of hydrogen peroxide and sulfuric acid and a solution containing different components are also applicable.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A method for manufacturing a semiconductor device, comprising:
    forming a first metal film over an electrode pad disposed on a substrate;
    forming a second metal film on the first metal film;
    forming a first oxide film on a surface of the first metal film and a second oxide film on a surface of the second metal film by oxidizing the surfaces of the first metal film and the second metal film;
    removing the first oxide film; and
    melting the second metal film after removing the first oxide film.

2. The method according to claim 1, wherein a metal surface of the first metal film is exposed by removing the first oxide film.

3. The method according to claim 2, wherein part of the first metal film is removed along with the first oxide film in removing the first oxide film.

4. The method according to claim 3, wherein, as a result of removing the part of the first metal film along with the first oxide film, a side surface of the first metal film is receded inward with respect to a side surface of the second metal film.

5. The method according to claim 1, wherein, after the surfaces of the first metal film and the second metal film are oxidized, the first oxide film is removed by being exposed to a solution having a higher etching rate for the first oxide film than for the second oxide film.

6. The method according to claim 5, wherein the first metal film contains Ni, the second metal film contains Sn and Ag, and the solution contains hydrogen peroxide and sulfuric acid.

7. The method according to claim 1, further comprising, before forming the first metal film, forming a third metal film that covers a region including a surface of the electrode pad, the third metal film having a single layer structure or a multilayer structure,
    wherein the first metal film is formed above the electrode pad by electroplating using the third metal film so that the first metal film is separated from the electrode pad with the third metal film in between, and the second metal film is formed on the first metal film.

8. The method according to claim 7, further comprising, after formation of the first and second metal films, removing portions of the third metal film exposed from the first metal film,
    wherein after the portions of the third metal film are removed, the surfaces of the first and second metal films are oxidized.

9. The method according to claim 7, wherein
    after formation of the first and second metal films, portions of the third metal film are exposed, and the surfaces of the first and second metal films and the surface of the portions of the third metal film are oxidized, and
    after the surfaces of the first and second metal films, and portions of the third metal film are oxidized, the first oxide film is removed together with a third oxide film formed on the surface of the portions of the third metal film.

10. The method according to claim 9, further comprising, after the third oxide film is removed, a step of removing the portions of the third metal film.

11. The method according to claim 1, wherein melting the second metal film is conducted in a reducing gas atmosphere.

12. The method according to claim 1, wherein in oxidizing the surfaces of the first and second metal films, the first and second metal films are exposed to an oxidizing gas atmosphere.

13. The method according to claim 12, wherein the first and second metal films are exposed to an oxidizing gas atmosphere having a temperature lower than the melting point of the second metal film.

* * * * *